United States Patent
Hong et al.

(10) Patent No.: US 10,114,561 B2
(45) Date of Patent: Oct. 30, 2018

(54) MEMORY CONTROLLERS, MEMORY SYSTEMS, AND METHODS RELATING TO WEAR-LEVELING

(71) Applicant: SK hynix Inc., Icheon-si, Gyeonggi-do (KR)

(72) Inventors: Do-Sun Hong, Icheon-si (KR); Jung Hyun Kwon, Seoul (KR); Donggun Kim, Hwaseong-si (KR); Yong Ju Kim, Seoul (KR); Sungeun Lee, Icheon-si (KR); Jae Sun Lee, Seoul (KR); Sang Gu Jo, Bucheon-si (KR); Jingzhe Xu, Seoul (KR)

(73) Assignee: SK hynix Inc., Icheon-si, Gyeonggi-do (KR)

( * ) Notice: Subject to any disclaimer, the term of this patent is extended or adjusted under 35 U.S.C. 154(b) by 3 days.

(21) Appl. No.: 15/493,289

(22) Filed: Apr. 21, 2017

(65) Prior Publication Data

US 2017/0344278 A1 Nov. 30, 2017

(30) Foreign Application Priority Data

May 25, 2016 (KR) ........................ 10-2016-0064322

(51) Int. Cl.
| | | |
|---|---|---|
| *G11C 13/00* | (2006.01) | |
| *G06F 3/06* | (2006.01) | |
| *G11C 16/34* | (2006.01) | |
| *G06F 12/10* | (2016.01) | |
| *G06F 12/02* | (2006.01) | |

(52) U.S. Cl.
CPC .......... *G06F 3/0616* (2013.01); *G06F 3/0632* (2013.01); *G06F 3/0653* (2013.01); *G06F 3/0656* (2013.01); *G06F 3/0659* (2013.01); *G06F 3/0679* (2013.01); *G06F 12/0246* (2013.01); *G06F 12/10* (2013.01); *G11C 16/349* (2013.01); *G06F 2212/1041* (2013.01); *G06F 2212/65* (2013.01); *G06F 2212/7205* (2013.01)

(58) Field of Classification Search
CPC . G11C 13/0035; G11C 16/349; G06F 3/0616; G06F 12/10; G06F 3/0679; G06F 3/0656; G06F 3/0653; G06F 3/0632; G06F 3/0659; G06F 2212/65
See application file for complete search history.

(56) References Cited

U.S. PATENT DOCUMENTS

| | | | | |
|---|---|---|---|---|
| 8,874,835 | B1 * | 10/2014 | Davis .................... | G06F 3/0679 711/103 |
| 9,329,789 | B1 * | 5/2016 | Chu ........................ | G06F 3/064 |
| 2007/0208904 | A1 * | 9/2007 | Hsieh .................. | G06F 12/0246 711/103 |
| 2009/0248962 | A1 * | 10/2009 | Kim .................... | G06F 12/0246 711/103 |
| 2009/0285008 | A1 * | 11/2009 | Jeong ...................... | G11C 8/10 365/148 |

(Continued)

FOREIGN PATENT DOCUMENTS

KR 1020120128978 A 11/2012

*Primary Examiner* — Khamdan Alrobaie
(74) *Attorney, Agent, or Firm* — William Park & Associates Ltd.

(57) ABSTRACT

A memory controller may be provided. The memory controller may include a wear-leveler may be configured to determine whether execution of a swapping operation is required based on reception of a write command for a stack region.

15 Claims, 8 Drawing Sheets

(56) References Cited

U.S. PATENT DOCUMENTS

2015/0149728 A1* 5/2015 Moon ................. G06F 12/0868
　　　　　　　　　　　　　　　　　　　　　　711/133
2015/0309926 A1　10/2015 Damle et al.
2015/0347038 A1* 12/2015 Monteleone .......... G06F 3/0616
　　　　　　　　　　　　　　　　　　　　　　711/103

* cited by examiner

MEMORY CONTROLLERS, MEMORY SYSTEMS, AND METHODS RELATING TO WEAR-LEVELING

CROSS-REFERENCE TO RELATED APPLICATIONS

The present application claims priority under 35 U.S.C 119(a) to Korean Application No. 10-2016-0064322, filed on May 25, 2016, which is herein incorporated by reference in its entirety.

BACKGROUND

1. Technical Field

Various embodiments of the present disclosure may generally relate to memory controllers, memory systems, and methods relating to wear-leveling.

2. Related Art

Nonvolatile memory devices may be employed in digital electronic systems that operate at a high speed for wireless communication or other applications. The nonvolatile memory devices such as resistive random access memory (ReRAM) devices and phase change random access memory (PCRAM) devices have limited write endurance. The write endurance may be defined as the number of program/erasure operations that can be applied to memory blocks until the reliability of storage media including the memory blocks is lost. The write endurance may be calculated by evaluating how many times the memory blocks can be entirely programmed and erased.

Wear-leveling (also written as wear levelling) is a technique used for prolonging the write endurance of the storage media. According to the wear-leveling technique, the write operations may be performed evenly across memory cells in the storage medium to reduce the number of times that specific memory cells are repeatedly programed. As a result, all of the memory cells may be equally used during the write operations. In general, the wear-leveling operation may be executed by a memory controller. For example, if a write command is applied to the storage medium, the memory controller may execute an appropriate mapping operation between a logical address and a physical address of selected memory cells and may change the physical address of the selected memory cells into another physical address to newly select memory cells when the number of the overwrites of the selected memory cell is greater than a predetermined number of times.

SUMMARY

According to an embodiment, a memory system comprising a phase change random access memory (PCRAM), and a memory controller configured to control the PCRAM according to a command. The memory controller performs a swapping operation for swapping a stack region with a memory region other than the stack region if a write counting number is greater than a threshold value based on a write command to the stack region being inputted to the memory controller.

According to an embodiment, a wear-leveling method of a memory system controlling a phase change random access memory (PCRAM) according to a write command, the wear-leveling method comprising discriminating whether a write counting number of a stack region is greater than a threshold value if a target region of the write command is the stack region, and performing a swapping operation for swapping the stack region for a memory region other than the stack region if the write counting number is greater than the threshold value.

According to an embodiment, a memory controller comprising a wear-leveler configured to determine whether execution of a swapping operation is required based on reception of a write command for a stack region. If a write counting number is greater than a threshold value, then the wear-leveler determines that a swapping operation is required to swap a stack region with a memory region other than the stack region.

According to an embodiment, a wear-leveling method of a memory controller for a stack region according to a write command, the wear-leveling method comprising discriminating whether a write counting number of a stack region is greater than a threshold value if a target region of the write command is the stack region, and determining that a swapping operation is required for swapping the stack region for a memory region other than the stack region if the write counting number is greater than the threshold value.

DETAILED DESCRIPTION

In the following description of the embodiments, it will be understood that the terms "first" and "second" are intended to identify an element, but not used to define only the element itself or to mean a particular sequence. In addition, when an element is referred to as being located "on", "over", "above", "under" or "beneath" another element, it is intended to mean relative position relationship, but not used to limit certain cases that the element directly contacts the other element, or at least one intervening element is present therebetween. Accordingly, the terms such as "on", "over", "above", "under", "beneath", "below" and the like that are used herein are for the purpose of describing particular embodiments only and are not intended to limit the scope of the present disclosure. Further, when an element is referred to as being "connected" or "coupled" to another element, the element may be electrically or mechanically connected or coupled to the other element directly, or may form a connection relationship or coupling relationship by replacing the other element therebetween.

Various embodiments are directed to memory systems and wear-leveling methods of the memory systems.

Figure 1:
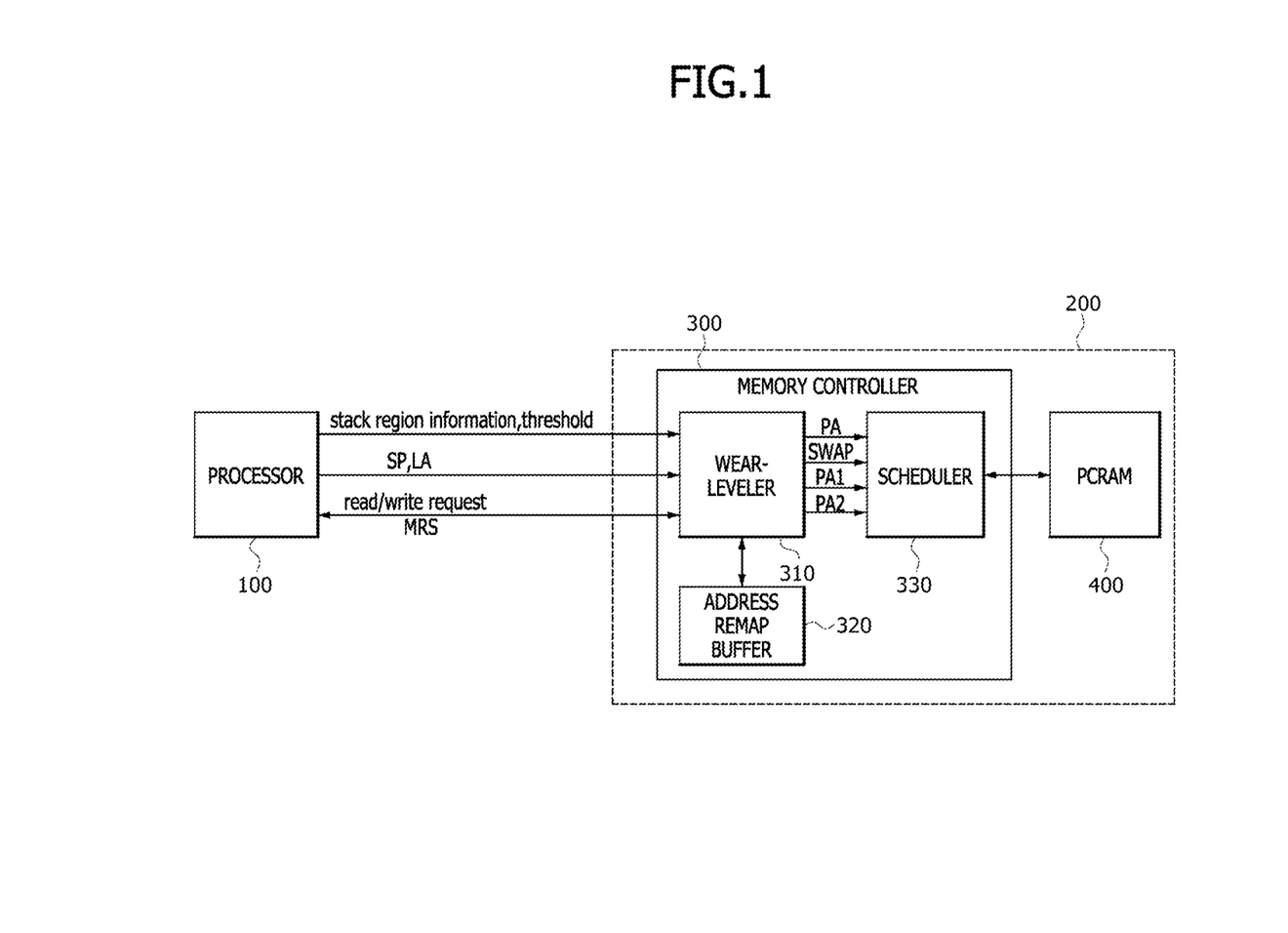
FIG. 1 is block diagram illustrating a representation of an example of a configuration of a memory system together with a processor according to an embodiment.

FIG. 1 is block diagram illustrating a representation of an example of a configuration of a memory system 200 together with a processor according to an embodiment. Referring to FIG. 1, the memory system 200 may be configured to include a memory controller 300 and a phase change random access memory (PCRAM) 400. Although not illustrated in the drawings, an interface device may be coupled between the memory controller 300 and the PCRAM 400. The memory controller 300 may control overall operations of the PCRAM 400 according to a request of the processor 100. In order to control the operations of the PCRAM 400, the memory controller 300 may include a wear-leveler 310, an address remap buffer 320 and a scheduler 330. In an embodiment, the memory controller 300 may receive stack region information, a threshold value, a stack pointer SP and a logical address LA from the processor 100. The stack region information may include a start address of the stack region and a range of the stack region. In an embodiment the stack region information may include a stack area. The memory controller 300 may control a write operation and a read operation of the PCRAM 400 according to a read/write request command of the processor 100 and may set a configuration of information stored in a register of the memory controller 300 in response to a mode register set (MRS) signal. In an embodiment, the stack region information and the threshold value may be stored in an internal register of the memory controller 300 in advance by the MRS signal. In such a case, the memory controller 300 may not receive the stack region information and the threshold value from the processor 100.

The wear-leveler 310 may receive a write command from the processor 100 to decide whether a wear-leveling of the stack region is required, if a target region is the stack region. If a wear-leveling of the stack region is not required, the wear-leveler 310 may transmit a physical address PA corresponding to the logical address LA of the stack region to the scheduler 330. If a wear-leveling of the stack region is required, the wear-leveler 310 may transmit a swap command SWAP as well as a first physical address PA1 of a hot region and a second physical address PA2 of a cold region to the scheduler 330. During the above wear-leveling process, information on the updated addresses may be transmitted to the address remap buffer 320.

Logical addresses of the stack region may be stored in the address remap buffer 320. If the wear-leveling process is executed by the wear-leveler 310 to swap the hot region for the cold region, information on the logical address of the stack region may be updated according to a command of the wear-leveler 310 to reflect logical addresses of the swapped stack regions and the updated logical addresses of the changed stack regions may be transmitted to the wear-leveler 310. For example, if the hot region has a first logical address LA1 and the cold region has a second logical address LA2, an address of the hot region may be updated into the second logical address LA2 and an address of the cold region may be updated into the first logical address LA1. The updated addresses of the hot region and the cold region may be transmitted to the wear-leveler 310.

If the wear-leveling of the stack region is not required, the scheduler 330 may receive the physical address PA from the wear-leveler 310 and may execute a write operation for storing data into a stack region corresponding to the physical address PA among stack regions of the PCRAM 400. If the wear-leveling of the stack region is required, the scheduler 330 may receive the swap command SWAP, the first physical address PA1 and the second physical address PA2 from the wear-leveler 310. The first physical address PA1 may correspond to a physical address of the hot region, and the second physical address PA2 may correspond to a physical address of the cold region. The scheduler 330 may execute a write operation for storing data into a stack region corresponding to the second physical address PA2 (i.e., the physical address of the cold region) among the stack regions of the PCRAM 400.

Figure 2:
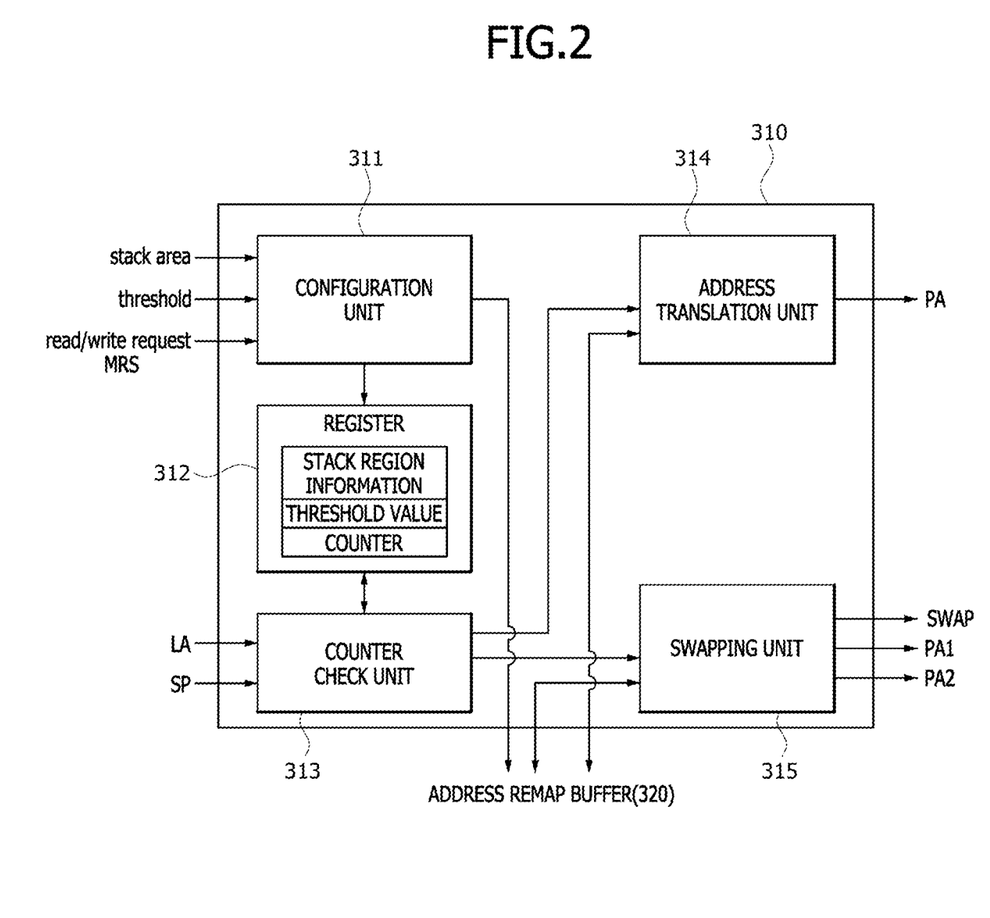
FIG. 2 is a block diagram illustrating a representation of an example of a configuration of a wear-leveler included in the memory system of FIG. 1.

FIG. 2 is a block diagram illustrating a representation of an example of a configuration of the wear-leveler 310 included in the memory controller 300 of the memory system 200 illustrated in FIG. 1. Referring to FIG. 2, the wear-leveler 310 may be configured to include a configuration unit (CFG) 311, a register 312, a counter check unit 313, an address translation unit 314 and a swapping unit 315.

The configuration unit (CFG) 311 may receive the read/write request command from the processor (100 of FIG. 1) and may initialize the wear-leveler 310. The configuration unit (CFG) 311 may receive the stack region information (i.e., stack area) and the threshold value from the processor 100 and may transmit the stack region information and the threshold value to the register 312. The configuration unit (CFG) 311 may transmit the start address of the stack region and the range of the stack region, which are included in the stack region information, to the address remap buffer 320 to specialize the address of the stack region, in the address remap buffer 320. The register 312 may receive the stack region information and the threshold value from the configuration unit (CFG) 311 and may store the stack region information and the threshold value. The register 312 may store a count number which is outputted from the counter check unit 313.

The counter check unit 313 may generate an increased count number if the write request command to the stack region is applied to the configuration unit (CFG) 311, that is, if the logical address LA and the stack pointer SP of the stack region are inputted to the counter check unit 313, and the increased count number may be stored in the register 312. This operation may be executed until the wear-leveling of the stack region is required, that is, until the count number is greater than the threshold value. If the wear-leveling of the stack region is required, the counter check unit 313 may reset the count number of the register 312 to initialize the register 312. If the wear-leveling of the stack region is not required, the counter check unit 313 may apply an enablement signal to the address translation unit 314 to operate the address translation unit 314. If the wear-leveling of the stack region is required, the counter check unit 313 may apply an enablement signal to the swapping unit 315 so that a swapping operation is executed by the swapping unit 315.

The address translation unit 314 may convert the logical address LA of the stack region, which is stored in the address remap buffer 320, into the physical address PA according to the enablement signal outputted from the counter check unit 313. The swapping unit 315 may select a portion of a memory region as the cold region and may appoint the selected cold region as a hot region (a stack region). The swapping unit 315 may output the first physical address PA1 of the hot region appointed as the cold region, the second physical address PA2 of the cold region appointed as the hot region, and the swap command SWAP. During the above process, the swapping unit 315 may transmit the address information on the changed stack regions to the address remap buffer 320 so that the address information in the address remap buffer 320 is updated. In an embodiment, after the swapping unit 315 divides the stack region into a plurality of sub-regions, the swapping unit 315 may select a first sub-region of the stack region corresponding to the stack pointer SP and a second sub-region of the stack region not being used and may swap the first sub-region for the second sub-region.

Figure 3:
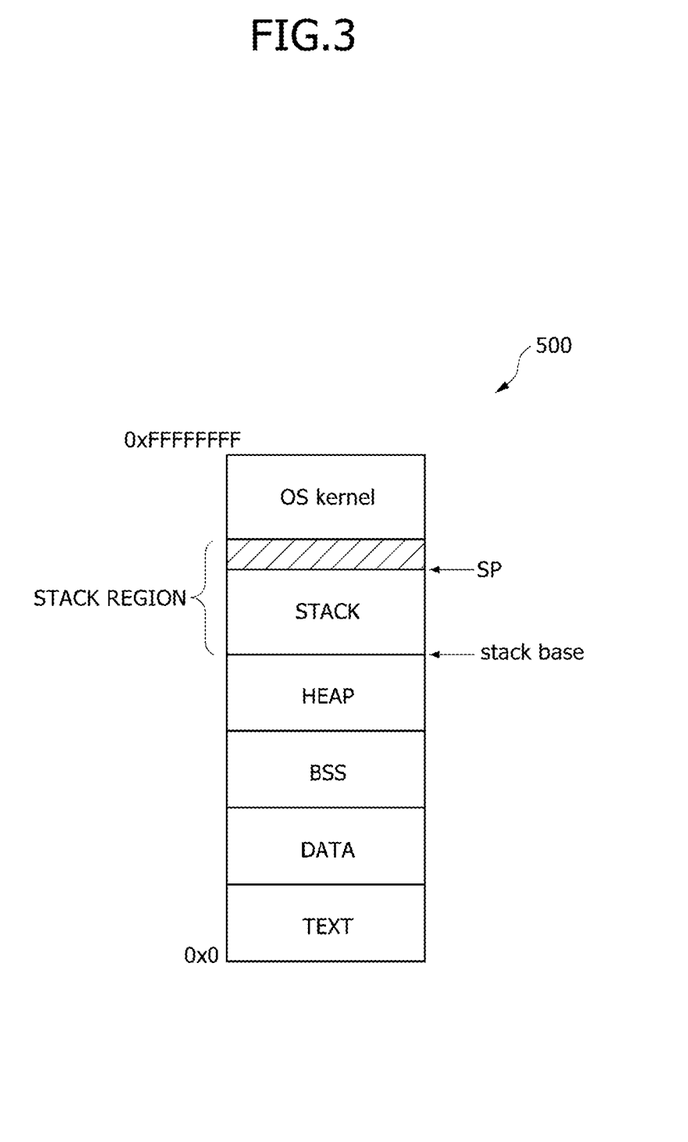
FIG. 3 is a schematic diagram illustrating a representation of an example of a structure of a memory when a program is installed in the memory by a processor.
Figure 4:
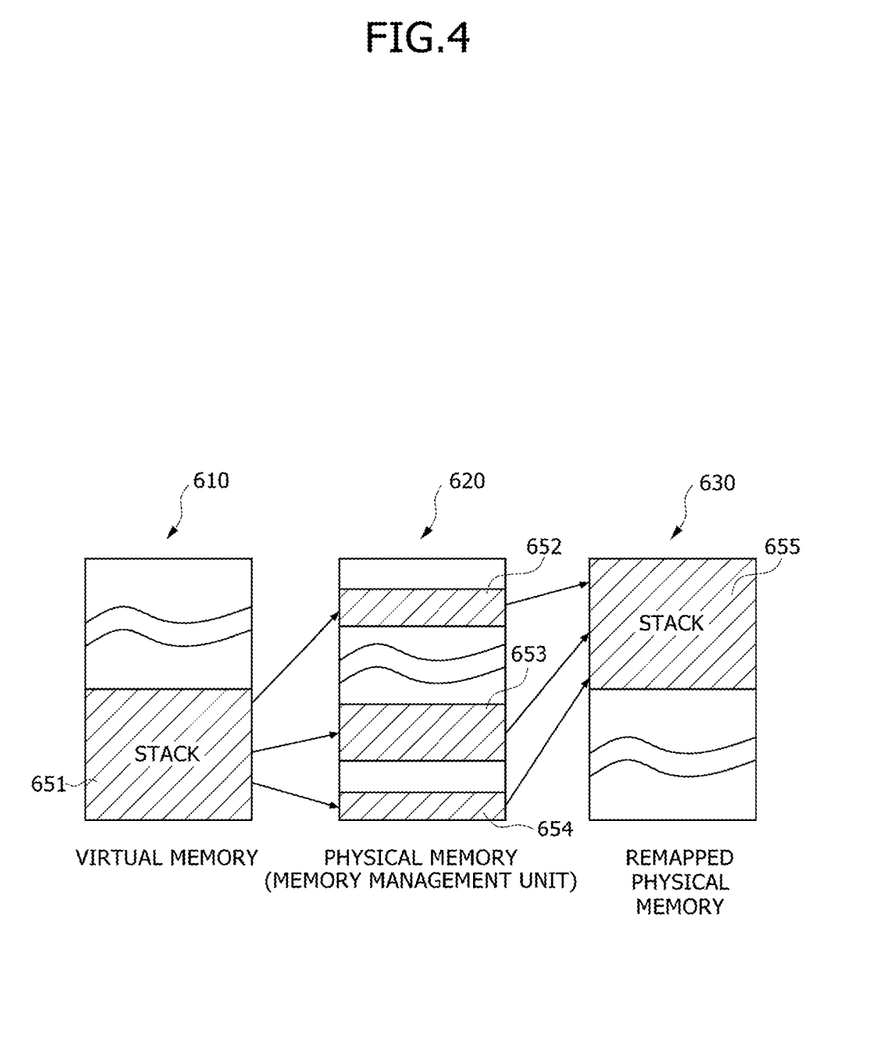
FIG. 4 is a schematic diagram illustrating a representation of an example of a virtual memory, a physical memory managed by a memory management unit, and a remapped physical memory in the memory structure of FIG. 3.

FIG. 3 is a schematic diagram illustrating a representation of an example of a memory structure 500 of the PCRAM 400 when a program is installed in the PCRAM 400 by the processor 100. FIG. 4 is a schematic diagram illustrating a virtual memory 610, a physical memory 620 managed by a memory management unit, and a remapped physical memory 630, in the memory structure 500 of FIG. 3. Referring to FIG. 3, when a program or a thread is installed in the PCRAM 400 by the processor 100, the memory structure 500 expanded from a low-order address to a high-order address may be partitioned into a text region TEXT, a data region DATA, a block started by symbol region BSS, a heap region HEAP, a stack region STACK and an operating system kernel region OS KERNEL. The memory structure 500 is a merely an example of a suitable structure for the PCRAM 400. Accordingly, in some other embodiments, the PCRAM 400 may have a memory structure different from the memory structure 500 illustrated in FIG. 3 when a program is installed in the PCRAM 400 by the processor 100. The text region TEXT (also, referred to as a code region) may be a region controlled by a machine language, and program commands may be allocated in the text region TEXT. The data region DATA may be a region that is generated when programs are executed and is returned to the system when the execution of the programs ends. Global variables, static variables, arrays and structures may be stored in the data region DATA. The block started by symbol region BSS and the heap region HEAP may be regions in which memory spaces are dynamically allocated when the programs are loaded. The stack region STACK may be a temporary memory region automatically used by the programs. For example, the stack region STACK may be a region that stores temporary data such as local variables, parameters, return values, or the like. Accordingly, the stack region STACK may be a region that is generated when functions are called and is returned to the system when the functions end. The stack pointer SP may indicate a position that is currently used in the stack region STACK. That is, the current position in the stack region STACK may correspond to a region from a stack base to the stack pointer SP. The operating system kernel region OS KERNEL may be a kernel region used by the operating system. In the memory structure 500 described above, a target region of the write command may be the stack region STACK or the data region DATA. In an embodiment, the memory structure includes values 0x0 to 0xFFFFFFFF.

Referring to FIG. 4, the processor (100 of FIG. 1) may set the virtual memory 610 in which the stack region STACK is continuously allocated to constitute a single region 651. This virtual memory 610 may correspond to the physical memory 620 managed by a memory management unit MMU. In the physical memory 620, a stack region may be configured to have a single continuous region. However, in general, the stack region in the physical memory 620 may be configured to include a plurality of separate regions 652, 653 and 654 which are discontinuously distributed, as illustrated in FIG. 4. In such a case, the physical memory 620 may be remapped to provide the remapped physical memory 630, and the remapped physical memory 630 may have a stack region 655 corresponding to a single continuous region. Subsequently, a wear-leveling of the stack region 655 may be executed. In such a case, a position of the stack region 651 in the virtual memory 610 may be different from a position of the stack region 655 in the remapped physical memory 630.

Figure 5:
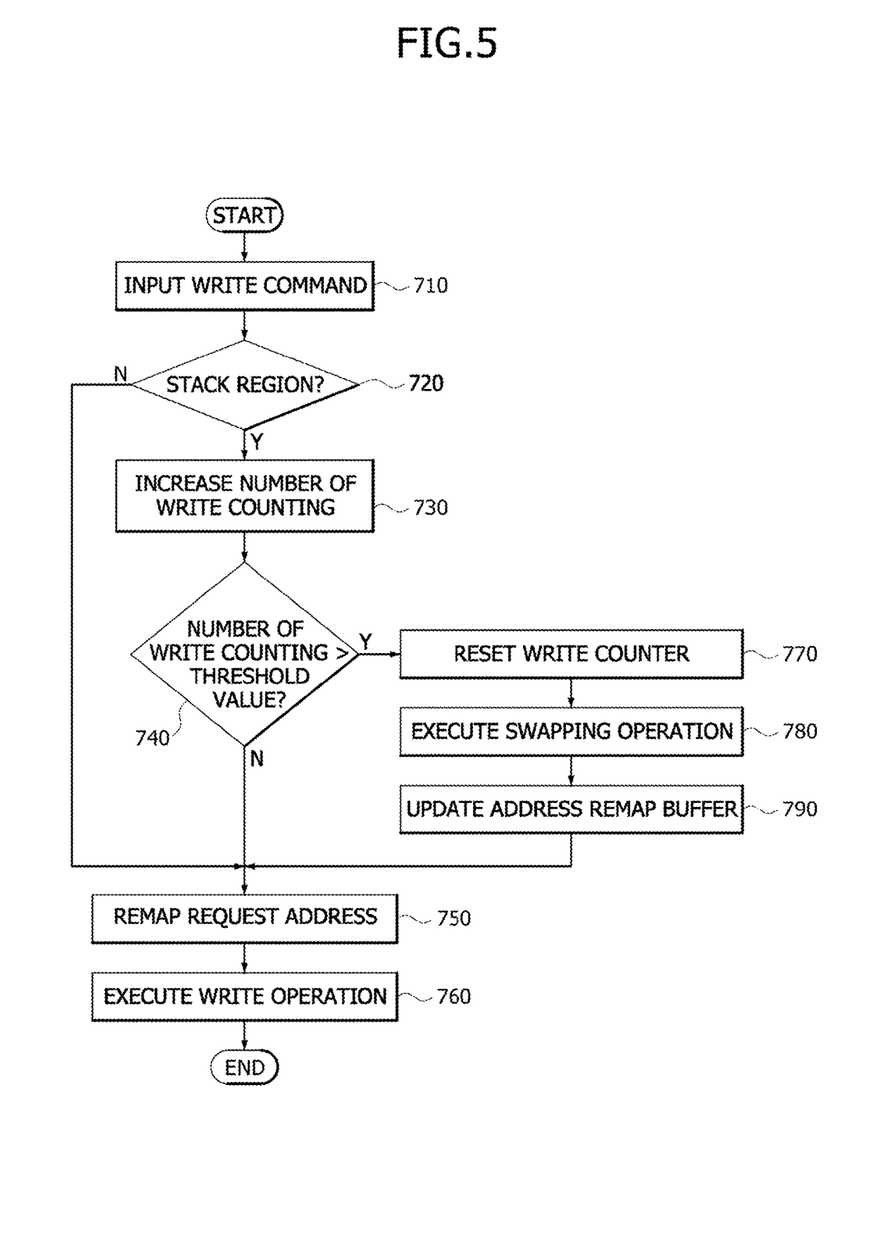
FIGS. 5 and 6 illustrate a flowchart of an operation of the memory system illustrated in FIG. 1.
Figure 6:
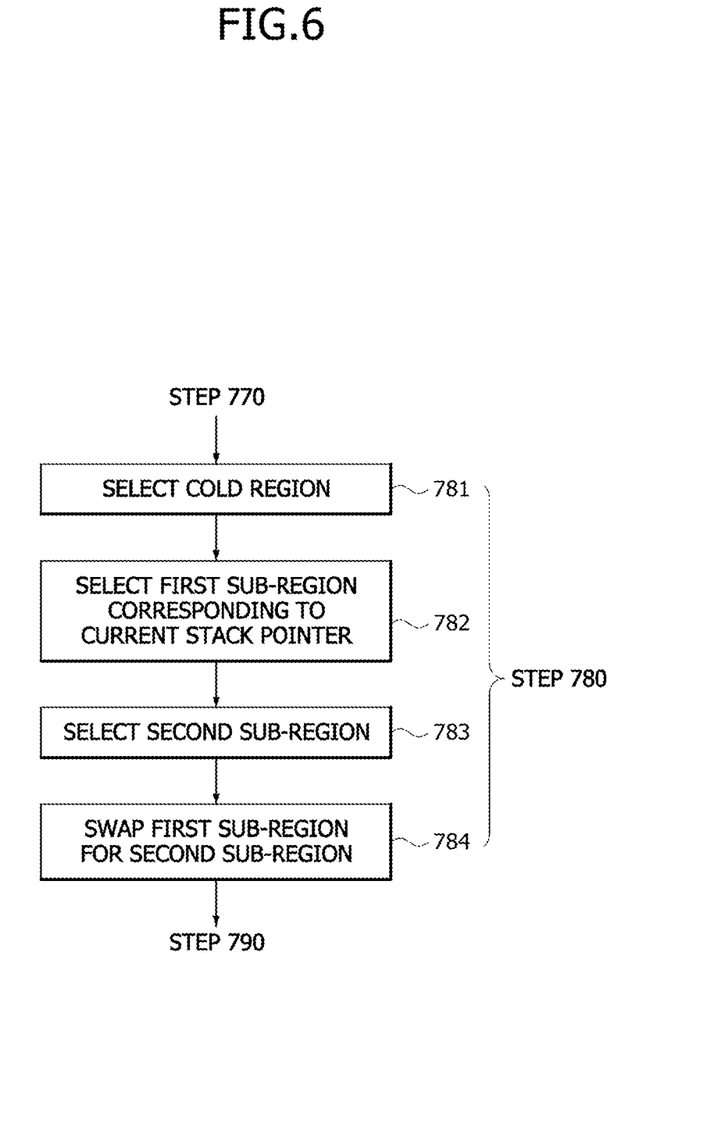
Figure 7:
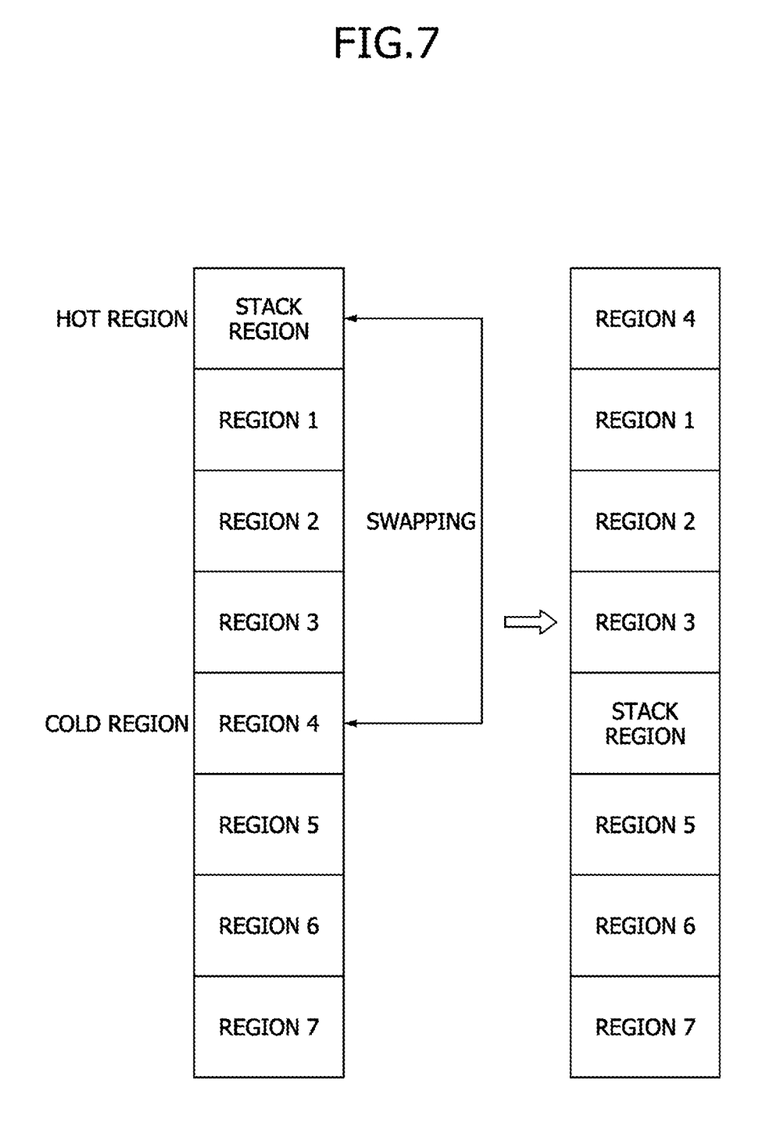
FIG. 7 is a schematic diagram illustrating an example of a swapping operation of a hot region and a cold region of a stack region in a memory structure of FIG. 3.
Figure 8:
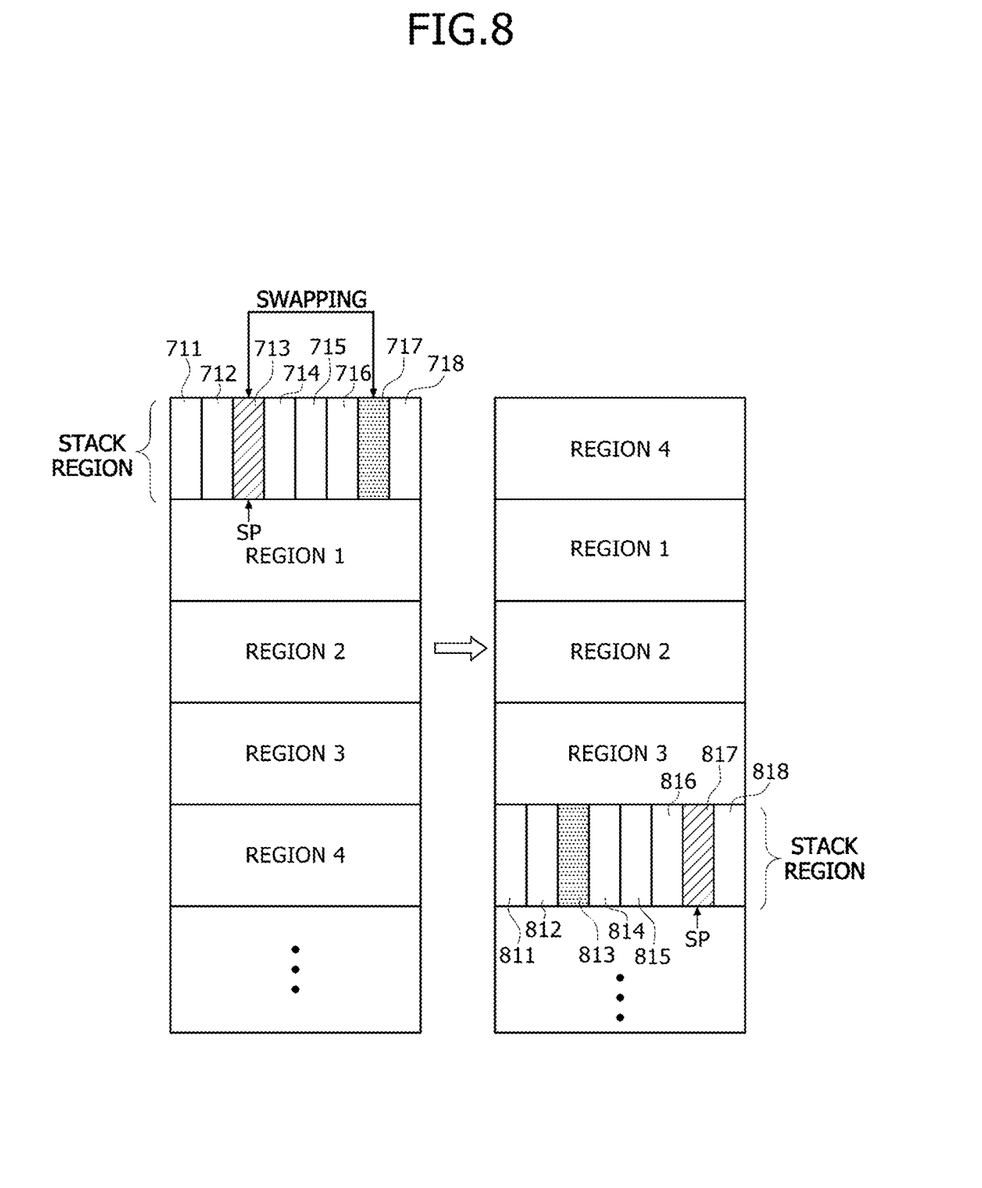
FIG. 8 is a schematic diagram illustrating an example of a swapping operation of a hot region and a cold region of a stack region in a memory structure of FIG. 3.

FIGS. 5 and 6 illustrate a flowchart of an operation of the memory system 200 illustrated in FIG. 1. FIG. 7 is a schematic diagram illustrating an example of a swapping operation of a hot region and a cold region in the stack region STACK of the memory structure 500 illustrated in FIG. 3, and FIG. 8 is a schematic diagram illustrating an example of a swapping operation of a hot region and a cold region in the stack region STACK of the memory structure 500 illustrated in FIG. 3. Referring to FIGS. 1, 2, 5 and 6, a write command (i.e., the write request) outputted from the processor 100 may be inputted to the configuration unit 311 of the wear-leveler 310 included in the memory controller 300 (see a step 710). The counter check unit 313 of the wear-leveler 310 may discriminate whether a target region of the write command is a stack region (see a step 720). If the target region of the write command is not a stack region, the address translation unit 314 may remap a request address of a memory region generated by the write request to the address remap buffer 320 of the memory controller 300 (see a step 750). Subsequently, a write operation may be applied to the memory region allocated by the request address (see a step 760). In the step 720, if the target region of the write command is a stack region, the counter check unit 313 may operate the counter of the register 312 to increase a write counting number stored in the register 312 (see a step 730). The increased number of write counting may be compared with the threshold value to discriminate whether the increased number of write counting is greater than the threshold value (see a step 740). If the increased number of write counting is not greater than the threshold value, the address translation unit 314 may remap a request address of a memory region generated by the write request to the address remap buffer 320 of the memory controller 300 (see the step 750). Subsequently, a write operation may be applied to the memory region allocated by the request address (see the step 760). In the step 740, if the increased number of write counting is greater than the threshold value, that is, if a wear-leveling of the stack region is required, the counter check unit 313 may initialize or reset the counter of the register 312 (see a step 770). Subsequently, the counter check unit 313 may enable the swapping unit 315 so that the swapping unit 315 perform a swapping operation (see a step 780).

In order to perform the swapping operation, the swapping unit 315 may select a cold region (see a step 781). Subsequently, the swapping unit 315 may transmit the swap command SWAP, the first physical address PA1 of a hot region, and the second physical address PA2 of the cold region to the scheduler 330 of the memory system 300. In an embodiment, the swapping operation of the step 780 may be performed by swapping the hot region for the clod region. That is, as illustrated in a left portion of FIG. 7, if the stack region corresponding to the target region of the write command is the hot region, the swapping unit 315 may select any one region (e.g., a region 4) among various memory regions (i.e., region 1-7) as the cold region. In such a case, the first physical address PA1 may correspond to a physical address of the stack region, and the second physical address PA2 may correspond to a physical address of the region 4. In an embodiment, the region 4 may be a portion of the data region (DATA of FIG. 3). The scheduler 330 may swap the stack region corresponding to the hot region and the region 4 selected as the cold region, in response to the swap command SWAP. As a result of the swapping operation, the stack region corresponding to the hot region may be set to be the region 4 and the region 4 corresponding to the previous cold region may be set to be the stack region, as illustrated in a right portion of FIG. 7.

In another embodiment, after the cold region is selected in the step 781, a first sub-region corresponding to the current stack pointer SP may be selected (see a step 782). Thereafter, a second sub-region may be selected (see a step 783). Subsequently, the first and second sub-regions may be swapped with each other (see a step 784). For example, as illustrated in a left portion of FIG. 8, the stack region may be partitioned into a plurality of sub-regions 711-718. In such a case, the sub-regions from the sub-region 711 to the sub-region 713 indicated by the stack pointer SP may correspond to sub-regions which are currently in use, and the remaining sub-regions 714-718 may correspond to sub-regions which are out of use. In this case, the sub-region 713 indicated by the current stack pointer SP may be selected as the first sub-region mentioned in the step 782, and an arbitrary sub-region (e.g., the sub-region 717) among the sub-regions being out of use may be selected as the second sub-region mentioned in the step 782. Subsequently, the first sub-region 713 corresponding to the hot region and the second sub-region 717 corresponding to the cold region may be swapped with each other (see the step 784). Next, the stack region may be swapped with an arbitrary region (e.g., the region 4) among the various memory regions other than the stack region. As a result, as illustrated in a right portion of FIG. 8, the previous stack region including the hot region may be set to be the region 4, and the previous region 4 may be set to be the stack region. In addition, the first sub-region 713 corresponding to the previous hot region may be set to be a second sub-region 817 corresponding to a cold region among sub-regions 811-818 in the stack region. The stack pointer SP may be set to be the second sub-region 817 that the first sub-region 713 corresponding to the previous hot region is swapped.

After the swapping operation is performed in the step 780, the address remap buffer 320 may be updated (see a step 790). The address translation unit 314 may covert a logical address corresponding to the second physical address PA2 of the cold region swapped as the stack region into a logical address of the stack region and may remap the converted logical address to the address remap buffer 320 (see the step 750). Similarly, the address translation unit 314 may covert a logical address corresponding to the first physical address PA1 of the stack region swapped as the cold region into a logical address of the cold region and may remap the converted logical address to the address remap buffer 320 (see the step 750). Subsequently, a write operation may be applied to the stack region allocated by the request address (see the step 760).

What is claimed is:

1. A memory system comprising:
a phase change random access memory (PCRAM), the PCRAM being partitioned into a stack region and a memory region other than the stack region when a program is installed in the PCRAM; and
a memory controller configured to control the PCRAM according to a command,
wherein the memory controller performs a swapping operation for swapping the stack region with the memory region other than the stack region if a write counting number is greater than a threshold value based on a write command to the stack region being inputted to the memory controller,
wherein the memory region other than the stack region includes a data region being a region that is generated when program is executed, and
wherein the stack region being a temporary memory region automatically used by the program.

2. The memory system of claim 1, wherein the memory controller includes:
a wear-leveler configured to discriminate whether execution of the swapping operation is required and configured to output a swap command, a first physical address of the stack region, and a second physical address of the memory region if the execution of the swapping operation is required;
a scheduler configured to receive the swap command, the first physical address, and the second physical address to perform a write operation of the PCRAM; and
an address remap buffer storing a logical address of the stack region.

3. The memory system of claim 2, wherein the wear-leveler includes:
a configuration unit configured to initialize the wear-leveler if the write command to the stack region is inputted and configured to receive stack region information and a threshold value;
a register configured to receive the stack region information and the threshold value from the configuration unit to store the stack region information and the threshold value and configured to store a write counting number;
a counter check unit configured to receive a stack pointer and the logical address of the stack region to discriminate whether the execution of the swapping operation is required;
an address translation unit configured to update information on the logical address stored in the address remap buffer to reflect address information changed by the swapping operation; and
a swapping unit configured to output the swap command, the first physical address and the second physical address.

4. The memory system of claim 3, wherein the configuration unit transmits a start address and a range of the stack region included in the stack region information to the address remap buffer to specialize an address of the stack region in the address remap buffer.

5. The memory system of claim 3,
wherein the counter check unit increases the write counting number stored in the register if a target region of the write command is the stack region; and
wherein the counter check unit resets the write counting number and operates the swapping unit if the increased write counting number is greater than the threshold value.

6. The memory system of claim 3,
wherein the counter check unit increases the write counting number stored in the register if a target region of the write command is the stack region; and
wherein the counter check unit converts the logical address of the stack region into a physical address using the address translation unit to output the converted physical address if the increased write counting number is equal to or less than the threshold value.

7. The memory system of claim 3, wherein the counter check unit converts a logical address of the memory region other than the stack region into a physical address using the address translation unit to output the converted physical address if a target region of the write command is the memory region other than the stack region.

8. The memory system of claim 3,
wherein the swapping unit selects a portion of the memory region as a cold region and changes the selected cold region into the stack region; and
wherein the swapping unit outputs the first physical address of the stack region changed into the cold region, the second physical address of the cold region change into the stack region, and the swap command.

9. The memory system of claim 8, wherein the swapping unit transmits the changed address information of the stack region and the cold region to the address remap buffer to update the logical address stored in the address remap buffer.

10. The memory system of claim 8,
wherein the swapping unit selects a first sub-region corresponding to the stack pointer among a plurality of sub-regions of the stack region and a second sub-region not being used among the plurality of sub-regions of the stack region; and
wherein the swapping unit swaps the first sub-region for the second sub-region.

11. A wear-leveling method of a memory system controlling a phase change random access memory (PCRAM) according to a write command, the wear-leveling method comprising:
partitioning the PCRAM into a stack region and a memory region other than the stack region when a program is installed in the PCRAM;
discriminating whether a write counting number of the stack region is greater than a threshold value if a target region of the write command is the stack region; and
performing a swapping operation for swapping the stack region for the memory region other than the stack region if the write counting number is greater than the threshold value,
wherein the memory region other than the stack region includes a data region being a region that is generated when program is executed, and
wherein the stack region being a temporary memory region automatically used by the program.

12. The wear-leveling method of claim 11, further comprising increasing the write counting number if the target region of the write command is the stack region.

13. The wear-leveling method of claim 11, further comprising resetting the write counting number if the write counting number is greater than the threshold value.

14. The wear-leveling method of claim 11, wherein performing the swapping operation includes:
selecting one of memory regions other than the stack region as a cold region;
swapping the stack region for the cold region; and
applying a write operation to the cold region.

15. The wear-leveling method of claim 14, wherein selecting one of the memory regions other than the stack region as the cold region if followed by:
selecting a first sub-region corresponding to a stack pointer among a plurality of sub-regions of the stack region;
selecting a sub-region being out of use among the plurality of sub-regions of the stack region as a second sub-region; and
swapping the first sub-region for the second sub-region.

* * * * *